United States Patent [19]

Przybyla et al.

[11] 4,152,655

[45] May 1, 1979

[54] ELECTRICAL APPARATUS FOR RECOGNIZING MISSING PULSES IN AN OTHERWISE REGULAR PULSE SEQUENCE OF VARYING FREQUENCY

[75] Inventors: Bernd Przybyla; Peter J. Schmidt, both of Schwieberdingen, Fed. Rep. of Germany

[73] Assignee: Robert Bosch GmbH, Stuttgart, Fed. Rep. of Germany

[21] Appl. No.: 837,724

[22] Filed: Sep. 29, 1977

[30] Foreign Application Priority Data

Oct. 2, 1976 [DE] Fed. Rep. of Germany ....... 2644646

[51] Int. Cl.² ............................................. H03K 5/18
[52] U.S. Cl. ..................................... 328/120; 328/44; 328/48; 324/239
[58] Field of Search ......................... 328/120, 44, 48; 324/237, 238, 240, 241, 242, 239

[56] References Cited

U.S. PATENT DOCUMENTS

| 3,213,375 | 10/1965 | St. John ............................ 328/120 X |
| 3,660,842 | 5/1972 | Ballantyne ........................ 328/120 X |

OTHER PUBLICATIONS

IBM Tech. Disclosure Bull., vol. 14, No. 11—Apr. 1972, pp. 3299-3299a, "Electron Dubbing of Timing Pulses", by J. H. Meier.

*Primary Examiner*—John S. Heyman
*Attorney, Agent, or Firm*—Frishauf, Holtz, Goodman & Woodward

[57] ABSTRACT

Omission of a pulse in an otherwise regular pulse sequence, such as may be produced by omission of a tooth of a rotating gear that is used to generate a pulse sequence through a pick-up, is utilized after the manner of a special framing pulse, saving the complications of providing a framing pulse, especially in gasoline engine ignition timing. A counter is started with the beginning of every pulse of the sequence and is operated at a multiple of the sequence frequency. If the frequency varies, the count status when the next pulse arrives will vary slightly and this variation may be caused to change the initial condition for the beginning of each count cycle to keep the repetitive counting generally in step with the varying frequency. When a pulse of the sequence is skipped, however, the repetitive counter goes into a range of content states well beyond those produced by frequency variation and a decoding stage with an appropriate threshold value stored therein gives an indication that a pulse has been missed, which prepares a response to the next pulse which will produce a timing reference signal instead of a correction to the circuits following the frequency of the observed pulse sequence. The latter and also an engine load sensor address an ROM to provide the timing angle signal.

17 Claims, 3 Drawing Figures

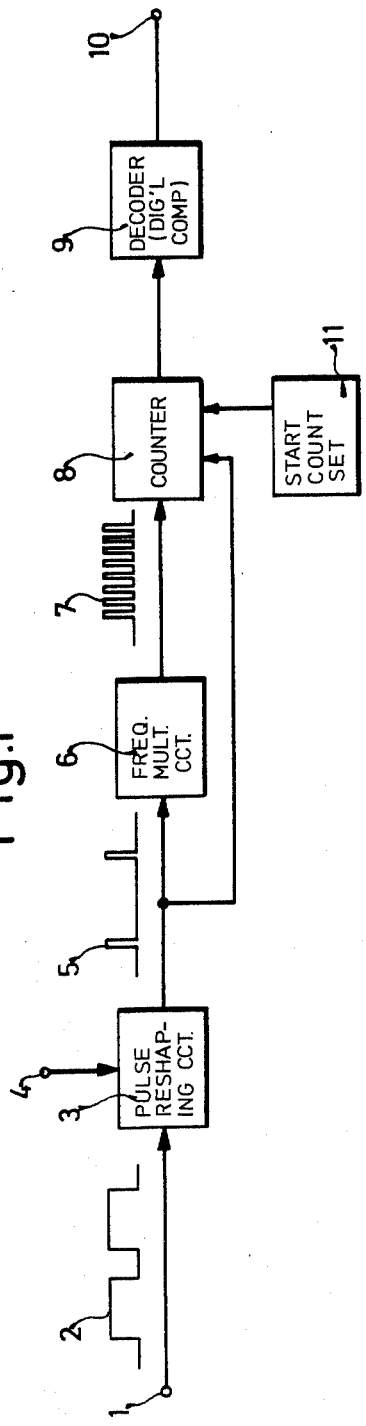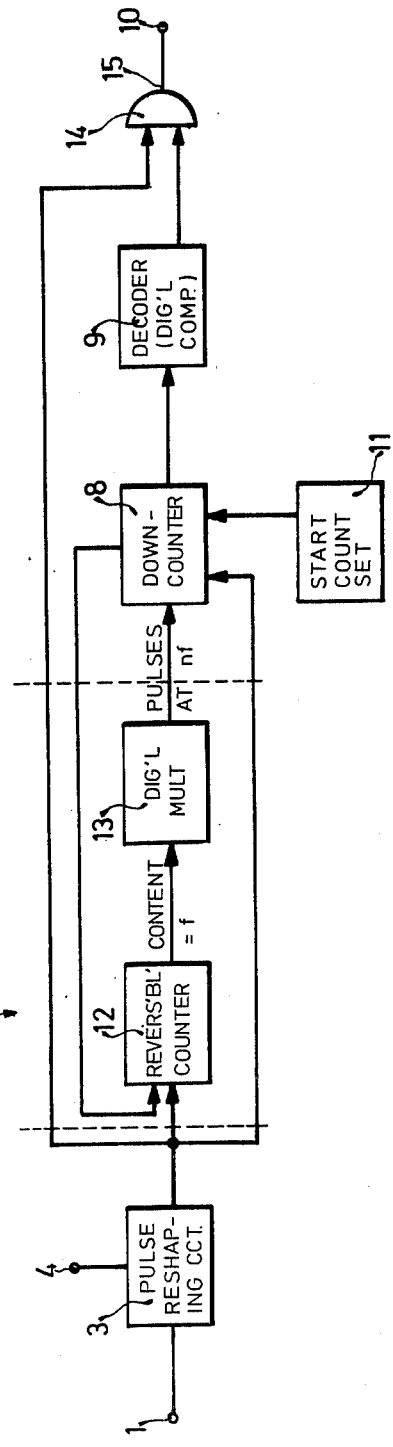

ELECTRICAL APPARATUS FOR RECOGNIZING MISSING PULSES IN AN OTHERWISE REGULAR PULSE SEQUENCE OF VARYING FREQUENCY

This invention relates to electric circuit apparatus for recognizing the absence of a missing pulse in an otherwise regular sequence of pulses either to prevent malfunction of an apparatus when the absence of a pulse is purposely left out of an otherwise regular pulse sequence as a kind of framing signal or the like.

The recognition of a missing pulse in an otherwise regular pulse sequence is of particular importance in the most varied regions of measurement technology, as well as in the control and regulation of machines and electrical systems.

The omission of a pulse in an otherwise regular pulse sequence can, on the one hand, be utilized as an intended control signal, as in the case of numerically controlled machine tools, or for the control of internal combustion engines with pulse transmitters operating in proportion to engine speed, in which case, for example, a trigger pulse is generated for determining the ignition moment compared to a reference position of the crankshaft, where the reference position can be regularly indicated by the skipping of a pulse of an otherwise regular pulse sequence. On the other hand, the failure of a pulse to appear in a regular sequence can also be regarded as an alarm signal in an otherwise continuous process, for example in the case of packaging or wrapping machinery operation in which the supply of wrapping material fails or the article is not presented in its place on the transmission, belt in either of which situations, no wrapping process can be carried out. Apparatus for recognition of the omission of a pulse in a sequence, finally, can also be of consequence for physiological measurements, as for example in monitoring the heartbeat of a patient. In the latter case, the skipping of a heart action can be recognized as an asystoly and indicated by an alarm.

Known apparatus for recognizing the omission of a pulse in an otherwise regular pulse sequence consists of a timing circuit that is set off with every new pulse of the sequence and thus forced into its switched-over condition. If a pulse of the sequence is omitted, the timing circuit flops over into another switching condition and triggers an output signal. It is furthermore also known to operate a counter at a frequency higher than the repetition rate of the pulse sequence and to stop and reset the counter at the occurrence of each pulse of the sequence in question and to compare the content of the counter with a predetermined value every time.

In German Pat. No. 1,917,389, a method and apparatus for generating trigger pulse is disclosed in which an extinction pulse generator produces a trigger pulse whenever a predetermined time spacing between two pulses is exceeded. The predetermined time is, however, fixedly set and requires switching over in the case of pulse repetition frequencies that vary strongly.

These circuits and devices have the disadvantage of being able to operate only on pulse sequences of at least approximately constant frequency. In many fields of applicability, it is required, however, to recognize pulse omissions even in pulse sequences of frequencies that vary with time. For such cases, it was necessary in the known equipment to make frequent switching between ranges of frequencies, a feature which is inconvenient either where there are closely succeeding frequency changes or where there is operation over long periods.

It is an object of the present invention, accordingly, to provide apparatus for detection of the omission of a pulse of an otherwise regular pulse sequence which is useable for pulse sequences that vary considerably in repetition rate with time.

SUMMARY OF THE INVENTION

Briefly, a second pulse sequence of a frequency that is a multiple of the pulse sequence to be followed is used to step a counter that is reset to a predetermined count upon the arrival of each new pulse of the sequence to be observed. A decoding circuit produces an output signal whenever the counter reaches a predetermined count condition that is not reached in the regular interpulse interval of the sequence even with the greatest expected frequency change rate. Preferably the value of count to which the counter is set at the beginning of each counting operation is the value of the frequency multiplication factor by which the frequency of the pulse sequence to be observed is multiplied to obtain the counting frequency. In that case, a down counter is used and the decoding stage is set to produce an output signal when a predetermined negative count content is reached.

Preferably, the frequency multiplication by a digital multi-operated from a reversible counter of which the content is representative of the pulse frequency as last measured. The stored count of the reversible counter is subject to variation in dependence upon the content of the first mentioned counter at the beginning of a new pulse of the pulse sequence to be observed. Preferably when the first mentioned counter at that moment has a positive count content, the reversible counter counts forward by one unit and when at that moment the count content of the first mentioned counter is negative, the reversible counter is set back by one unit.

The apparatus according to the invention has the advantage that it can set itself to recognize the omission of a pulse at the particular instantaneous frequency of the pulse sequence in question. In consequence, the recognition function can also be effective when the pulse sequence being observed varies strongly. Long period applications are likewise made possible without range switching from time to time or resetting of apparatus adjustments.

In a preferred form of the invention, the pulse sequence at the multiple frequency is controlled in phase by a digital phase regulation loop as is for example described in German published patent application (OS) No. 2 347 839.

A logical AND connection is provided in one embodiment to produce a pulse upon the appearance of a pulse of the observed sequence that follows the omission of a pulse, so that the omission of a pulse can be used as the start signal for further operations. Such provisions can considerably extend the field of application of the apparatus of the present invention.

The pulse sequence to be observed can in a preferred manner be a periodically moved reference body that generates pulses in a mechanical or electric pick-up device of a frequency proportional to the periodicity of the movement of the reference body. For example, the reference body can be a toothed wheel mounted on a rotating shaft and the pick-up can be magnetic or inductive. Toothed racks can be similarly used to produce pulses. A further possibility consists in the detection of pulses, for example photoelectrically, from the movement of articles piece by piece to or in wrapping or packing machinery. If the reference body is formed as a rotating toothed wheel that is driven by the crankshaft of an internal combustion engine, the teeth of the toothed wheel can be provided, in a further embodiment of the invention, as plug-in studs or pegs, so that the position of the missing tooth and hence of the missing pulse in the pulse cycle can be varied. This can be of advantage when the missing pulse is used to provide a start signal and it is desired to be able to vary its position relative to a reference point or reference position in or of the machinery.

The arrangement of an engine driven toothed wheel causing the generation of a series of pulses can be utilized for triggering ignition timing pulses at a preselected ignition moment in an engine. When the apparatus according to the invention detects the omission of a pulse, the magnitude of the signal corresponding to the ignition angle can be generated in a digital calculation circuit in dependence on various parameters and the signal in question can then trigger the ignition event under defined time relation to the omitted pulse.

In a particular form of the invention, an additional down counter is utilized having a counting rate that is the output frequency of the digital multiplier stage used with the reversible counter. In such cases, it is convenient to provide a switching stage that is responsive to the null condition of the additional down counter. The predetermined value from which the additional down counter starts a counting operation can be provided by a read-only memory at the beginning of the counting operation. The read-only memory can conveniently contain complete characteristic curve information, such as a table of corresponding values and the value to be read out may be determined utilizing both the content of the reversible counter and the content of still another counter as the ROM address. The other counter just mentioned is conveniently operated only during a fixed period determined by a timing circuit that is triggered by a switching stage responsive to the null of the reversible counter so as to measure the frequency oscillation modulated by an engine-load sensor.

The invention is further described by way of illustrative example with reference to the annexed drawings, in which:

FIG. 1 is a basic block diagram of an embodiment of equipment according to the invention;

FIG. 2 is a further basic diagram of an embodiment of apparatus according to the invention with a phase control loop.

Figure 3:
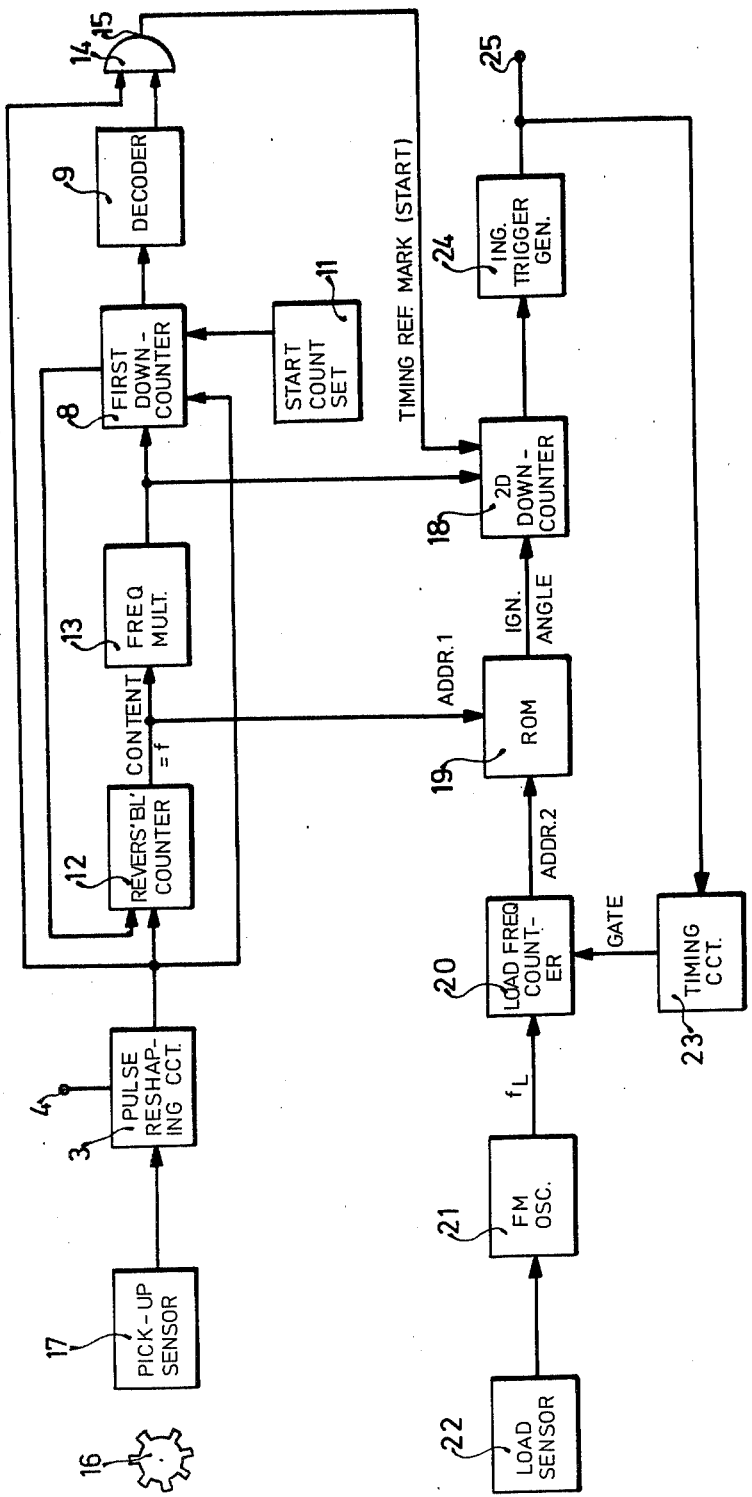
FIG. 3 is a still further basic circuit diagram of an embodiment of the invention having an apparatus for triggering the spark of an internal combustion engine in dependence upon speed and load of the engine.

FIG. 1 shows the basic circuit diagram of an embodiment of the present invention. The signals of a pulse sequence 2 that is approximately uniform except for certain missing pulses, proceed from the input terminal 1 to the input of a pulse-shaping stage 3 that has a control input 4. The output of the pulse-shaping stage 3 is connected with the input of a frequency multiplier, the output of which is in turn connected to the input of a counter 8. The output of the counter 8 is connected to a decoder stage 9 that delivers the output signal to the output terminal 10. The output of the pulse-shaping stage 5 is further connected with the start input of the counter 8. Finally, a fixed number store 11 is provided that is likewise connected with the counter 8.

The signals of the pulse sequence 2 proceed over the input terminal 1 to the input of the pulse-shaping stage 3, where they are standardized so that at the output of the pulse-shaping stage 3 a pulse sequence 5 is provided, all the pulses of which have a definite duration (width) and flank steepness. The circuit may, for example, consist of a gate opened by the beginning of each pulse of sequence 2 at input 1 for a duration equal to the period of standard width and steepness pulses continuously supplied from input 4 to another input of the gate so that a selected one of the latter pulses becomes a member of the output sequence 5. The pulse sequence 5 is multiplied in frequency by the frequency multiplier 6, so that a pulse sequence 7 of higher frequency is generated that is counted in a counter 8. Upon the arrival of a pulse of the pulse sequence 5 at the input of the frequency multiplier 6, a pulse is provided to the counter 8 to cause a prescribed count start magnitude to be set into the counter 8 after being read out of the fixed value store 11. The counter 8 now starts counting from the prescribed beginning magnitude that was set in by the fixed value store 11, changing the count by one unit with the arrival of each pulse of the pulse sequence 7. The content of the counter 8 is continually transferred to the decoder stage 9. Whenever a pulse in the otherwise regular pulse sequence 2 is missing, the counter 8 is not set at or near the usual time, because no shape pulse appears at the output of the circuit 3 to do it. The counter 8 then counts further and can pass beyond a positive or negative limit value determined by the content of the fixed value store 11 and provided as a reference value set in the decoder stage 9. In this case, when a pulse of the sequence being observed is missing, a relaxation circuit (flipflop) is operated and an output signal is furnished to the output terminal 10.

In FIG. 2, a further developed embodiment of the apparatus of the invention is represented. The frequency multiplier 6 is in this case constituted by a reversible counter 12 and a digital multiplier stage 13. The digital multiplier stage 13 operates here as a count-to-frequency converter, so that the content at any time of the reversible counter 12 appears as a frequency at the output of the digital multiplier stage 13. The apparatus of FIG. 2 differs from that of FIG. 1 in that the counter 8 is coupled back to the input of the reversible counter. Furthermore, between the decoder stage 9 and the output terminal 10, a logic gate 14, which in this case has the function of an AND gate, is provided. The second input of the AND gate is connected to the output of the pulse-shaping stage 3. The output 15 of the logic gate 14 goes to the output terminal 10.

The manner of operation of the basic circuit can now be illustrated by an example. Let the fixed value store 11 contain the multiplication factor of the frequency multiplier 6 and let it be assumed that the counter 8 is constituted as a backwards counter, which is to say a down counter. The information feedback from the counter 8 to the reversible counter 12 determines the direction in which the reversible counter 12 will step. When the operation is in step, which is to say when the pulse sequence 5 is entirely regular, the frequency of the pulse sequence at the output of the digital multiplier stage 13 steps the counter 8 down exactly to zero in every cycle, since during a counting cycle n pulses reach the counter 8 from the digital multiplier stage 13, because each pulse of the pulse sequence 5 produces a counting cycle and there are n times as many pulses in the pulse sequence 7 as in the pulse sequence 5 if n is the frequency multiplication factor of the frequency multiplier 6. Since at the beginning of the counting cycle the content of the counter 8, which is in this case a down counter, is set to the value n, at the end of the counting cycle the counter 8 has counted down to zero. If however the frequency of the pulse sequence 5, following that of the pulse sequence 2 at the input terminal 1 varies, a positive or negative remainder content will be found in the counter 8 when the next pulse of the pulse sequence 5 arrives and this next pulse from the pulse-shaping stage 3 causes this remainder to be read into the reversible counter 12 through the feedback connection from the counter 8 to the reversible counter 12. Whether the remainder content in the counter 8 is positive or negative, when the next shaped pulse from the circuit 3 opens the reversible counter 12 to read in the remainder, determines whether the frequency of the observed pulse sequence has risen or has fallen. If one pulse of the sequence being observed at the input terminal 1 is missing, the counter 8 continues counting far into the negative count region. A particular negative threshold value is provided in the decoder stage 9 that is more negative than would be produced by a mere change in frequency of the sequence and must therefore correspond to a missing pulse situation, so that when this particular value of negative count is reached, an output pulse will be provided to one input of the logic gate 14. The logic gate 14 will not provide a signal at its output 15 for the output terminal 10 until the next shaped pulse from the pulse-shaping stage 3 has arrived. This arrangement assures that the indication of a missing pulse is given only when another pulse of the observed sequence has been detected, in other words when it is clear that the pulse sequence, except for the missing pulse, is inherently regular. The output signal can be suppressed in the event that the next pulse is missing also if the duration of the output signal of the decoder circuit 9 is appropriately limited.

FIG. 3 shows another illustrative embodiment of the apparatus according to the invention. A pick-up device 17 associated with a rotating toothed disk 16 provides output signals corresponding to each teeth of the disk to the pulse-shaping stage 3. The processing of the output signals delivered by the pulse-shaping stage 3 proceeds in the same way as described for the apparatus of FIG. 2. There is provided in addition, however, a load sensor 22 that provides a control signal to a frequency modulated oscillator 21 that may be referred to as the load-frequency converter. The latter delivers a signal, of which the frequency is significant, for the counter 20 which in turn is connected with the read-only memory (read-out store) 19. A second input of the read-only memory 19 is connected with the output of the reversible counter 12. The output of the read-only memory 19 is supplied to a second down counter 18, that has other inputs connected to the output of the digital multiplier stage 13 and with the output 15 of the logic gate 14 respectively. The output of the second down counter 18 is provided to a switching stage 24 the output of which is connected to the output terminal 25 of the circuit. The output of the switching stage 24 is also connected to a counting stage 23 that provides an output to a second input of the counter 20.

Let it be assumed, for instance, that the rotating disk 16 is driven by the crankshaft of a gasoline engine. There are then generated in the pick-up 17 signals having a frequency proportional to the speed of revolution (r.p.m) of the crankshaft of the engine. It is useful to mark the rotary position of the disk 16 by omitting a tooth from the regular sequence of teeth around its periphery, so that the pulse sequence that is provided to the pulse-shaping circuit 3 periodically skips a pulse. This marking or framing of the pulse sequence can be utilized, for example, to indicate the upper dead-point of the piston movement in a reference cylinder of the engine, which is a common type of reference position of an engine crankshaft in engine valve and ignition timing measurements. In a preferred embodiment of the apparatus of the invention, all of the teeth of the toothed disk are constituted as insertable and removable pegs or studs, so that the marking or framing of the resulting pulse sequence can be provided at a large number of possible positions of the disk circumference. The pulse cycles provided by the pick-up device 17 to the pulse-shaping circuit 3 are therefore regular except for the pulses that are missing because of the missing tooth or teeth utilized for marking. In other words, the missing pulse operates in the same way as a framing pulse is used in some recurrent pulse systems.

If the speed of the engine varies, the phase regulation above described provided by the frequency multiplying stage 6 will produce a corresponding correction. At the output of the reversible counter 12, there will then be a count content that is proportional to the speed of the engine. This value is then supplied to one input of a read-out store 19 (for example a read-only memory, a widely available device known by the acronym ROM), in which a so-called ignition characteristic field is stored. Such an ignition characteristic field makes possible the determination of the optimum ignition angle (degrees of crankshaft rotation) of an internal combustion engine for the particular combination of the parameters "speed" and "load". In other words, the speed and the load provide an address for the read-only memory which contains a table of all the answers for every possible combination of speed and load, each answer being an ignition timing angle, and in response to the proper address combination, the appropriate answer is furnished. For this purpose, the read-only memory, in addition to having an address input for speed which is furnished by the reversible counter 12, has a second address input for a signal proportional to load, which is produced in response to the load sensor 22 by the frequency modulated oscillator 21 in the form of a frequency proportional to the load that is furnished to a counter 20, which counts this frequency during a particular period of time determined by a timing circuit 23. With the provision of the signals proportional to speed and proportional to load, the place where the appropriate ignition angle is stored in the read-only memory can be addressed and the desired ignition angle can then be read out in response. The value thus read out in read into the second down counter 18 as an initial value for a counting cycle. The second down counter 18 is then caused to count down in step with the frequency multiplied pulse sequence provided at the output of the digital multiplier stage 13. The start pulse for the second down counter 18 is provided by the output 15 of the logic gate 14. If the down counter 18 counts down to zero from its initially set value, the switching stage 24 is put into operation and provides a signal at the output terminal 5 for triggering an ignition spark. At the same time, the timing circuit 23 is triggered that now enables the counter 20 to count the output frequency of the load sensitivity oscillator 21 for a predetermined period of time.

Although the invention has been most particularly described with reference to its application to the timing of gasoline engine ignition, it will be understood that a variety of applications of apparatus for detecting the omission of a pulse in an otherwise regular pulse sequence of varying frequency and it will also be recognized that although the invention has been described with reference to particular illustrative examples, variations and modifications are possible within the inventive concept.

We claim:

1. An apparatus for detection of one or more missing pulses of an otherwise regular pulse sequence comprising in combination:
   means for producing a second pulse sequence, having a frequency which is a multiple of said regular pulse sequence;
   a pulse counter (8) having its counting input connected to supply pulses of said second pulse sequence to said counter;
   means to set the content of said counter at a first predetermined count value immediately after the advent of a pulse of said regular pulse sequence and thereby requiring counting to begin anew from said first predetermined value;
   and decoding means for producing an output signal whenever the content of said counting means reaches a second predetermined count value, indicative of the failure of a pulse of said first regular pulse sequence to appear.

2. An apparatus as defined in claim 1, comprising also means for transferring out the content of said counting means (8) immediately before said counter is set at said first predetermined count value by said setting means and means responsive to the output of said transferring-out means for modifying an input of said means for producing a second pulse sequence and thereby regulating the frequency of said second pulse sequence.

3. An apparatus as defined in claim 2, in which said counter (8) is a down-counter, and said first predetermined count value is the frequency multiplication factor of said means for producing said second pulse sequence in response to pulses of said first pulse sequence, and in which also said second predetermined count value detectable by said decoding stage is a negative count value.

4. An apparatus as defined in claim 2, in which said means for producing said second pulse sequence comprises a frequency multiplier (6) consisting of a reversible counter (12) and a digital multiplier stage (13) and in which pulses of said first-mentioned pulse sequence (5) are applied to enable the counting input of said reversible counter (12), said counting input being connected to said transferring-out means, whereby the stored content of the count state of said reversible counter (12) is modifiable in response to the count condition of said first-mentioned counter (8).

5. An apparatus as defined in claim 4, in which said first-mentioned counter (8) is a down-counter and said first predetermined count value is the frequency multiplication factor of said means for producing said second pulse sequence, and in which the arrival of a pulse of said first-mentioned regular pulse sequence (5) is arranged to cause the advance by one unit of the count of said reversible counter (12) if, at the time of arrival of said pulse of said first-mentioned regular pulse sequence, said first-mentioned counter (8) has a positive count content.

6. An apparatus as defined in claim 4, in which said first-mentioned counter (8) is a down-counter and said first predetermined count value is the frequency multiplication factor of said means for producing said second pulse sequence, and in which said reversible counter (12) is constituted so that upon the arrival of a pulse of said first-mentioned regular pulse sequence (5) said reversible counter (12) is set back by one unit if, at the time of arrival of said pulse of said first-mentioned pulse sequence, said first-mentioned counter (8) has a negative count content.

7. An apparatus as defined in claim 1, in which a logic gate (14) is provided of which the inputs are respectively connected to the outputs of said decoding means (9) and to a source of pulses of said first-mentioned regular pulse sequence and of which gate the output (15) makes available a trigger pulse whenever a pulse is simultaneously present at both of its inputs.

8. An apparatus as defined in claim 2, in which said first-mentioned regular pulse sequence is generated by a pick-up device (17) standing in operative relationship with a reference body subjected to a periodic movement.

9. An apparatus as defined in claim 8, in which said reference body subjected to a periodic movement is a rotating toothed disk (16).

10. An apparatus as defined in claim 9, in which said toothed disk (16) has at least one tooth missing from a regular arrangement of teeth.

11. An apparatus as defined in claim 10, in which the teeth of said toothed disk (16) are constituted by plug-in pegs.

12. An apparatus as defined in claim 7, in which a second countdown counter (18) is provided which is connected so as to be started to count down from a third predetermined count value at a control frequency in response to a trigger pulse from said output (15) of said logic gate (14), and in which said control frequency at which said second countdown counter (18) is caused to operate is the output frequency of a digital multiplier stage (13) which together with a reversible counter (12) constitutes a frequency multiplier which constitutes said means for producing a frequency-multiplied second pulse sequence in response to said first-mentioned regular pulse sequence.

13. An apparatus as defined in claim 12, in which a switching stage (24) is provided that is caused to be switched over whenever said second countdown counter (18) reaches a null count condition.

14. An apparatus as defined in claim 12, in which a read-only memory (19) is provided and connected to said second countdown counter (18) in such a manner that a count value stored in said read-only memory (19) is transferred to said second countdown counter (18) in response to the start of a countdown counting cycle thereof in which, further, said read-only memory (19) is constituted as means for storing a characteristic coordinate field such that the count value to be read out therefrom for furnishing to said second countdown counter (18) is determined from both the count condition of said reversible counter (12) and the count condition of a third counter (20).

15. An apparatus as defined in claim 14, in which said third counter (20) has its counting input responsive to the signal of a pulse generator (21) of which the frequency is representative of a load condition of an engine.

16. An apparatus as defined in claim 15, in which said pulse generator (21) is responsive to a load responsive device (22) of an internal combustion engine and in which said first-mentioned regular pulse sequence is produced by a toothed wheel having at least one tooth of a regular tooth arrangement thereof missing, which wheel is rotated at a speed proportional to the speed of rotation of the crankshaft of said engine.

17. An apparatus as defined in claim 14, in which said read-only memory (19) is constituted so that it contains and stores an engine ignition characteristic coordinate value field expressed in count values for loading into said second countdown counter (18) when addressed by the respective count conditions of said reversible counter (12) and of said third counter (20).

* * * * *